(12) United States Patent
Wu et al.

(10) Patent No.: US 12,283,298 B2
(45) Date of Patent: Apr. 22, 2025

(54) MAGNETORESISTIVE RANDOM ACCESS MEMORY WITH DATA SCRUBBING

(71) Applicant: INTERNATIONAL BUSINESS MACHINES CORPORATION, Armonk, NY (US)

(72) Inventors: Heng Wu, Santa Clara, CA (US); Krishna Thangaraj, Poughkeepsie, NY (US); Eric Raymond Evarts, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 17/931,464

(22) Filed: Sep. 12, 2022

(65) Prior Publication Data

US 2024/0087630 A1   Mar. 14, 2024

(51) Int. Cl.
   *G11C 11/16*   (2006.01)
(52) U.S. Cl.
   CPC ...... *G11C 11/1677* (2013.01); *G11C 11/1673* (2013.01); *G11C 11/1693* (2013.01)
(58) Field of Classification Search
   CPC ............ G11C 11/1677; G11C 11/1673; G11C 11/1693; G11C 11/1675
   See application file for complete search history.

(56) References Cited

U.S. PATENT DOCUMENTS

| | | | |
|---|---|---|---|
| 8,775,865 B2 | 7/2014 | Yang | |
| 10,546,625 B2 | 1/2020 | Berger | |
| 10,553,301 B2 | 2/2020 | Narayan | |
| 11,195,568 B1 | 12/2021 | Atishay | |
| 11,204,835 B2 | 12/2021 | Lu | |
| 2014/0059405 A1* | 2/2014 | Syu | G11C 16/04 711/E12.008 |

(Continued)

FOREIGN PATENT DOCUMENTS

EP   2084709 B1   4/2014

OTHER PUBLICATIONS

Ambrogio et al., "Reducing the Impact of Phase-Change Memory Conductance Drift on the Inference of large-scale Hardware Neural Networks", Conference: 2019 IEEE International Electron Devices Meeting, Dec. 2019, 4 pages.

*Primary Examiner* — Uyen Smet
(74) *Attorney, Agent, or Firm* — Matthew Zehrer

(57) ABSTRACT

Embodiments are disclosed for a system that includes a data scrubbing circuit, a magnetoresistive random access memory (MRAM) having a memory array, and an analog persistent vital information circuit (APVIC) that performs a method. The method includes resetting weights corresponding to blocks of the memory array. The method further includes adjusting the weights based on a timer, data accesses on the memory blocks, and weight change values corresponding to the weights. The method also includes determining, in response to the timer, a data scrubbing threshold based on ambient temperature and magnetic field strength. The method additionally includes determining one of the weights meets the data scrubbing threshold. Further, the method includes providing, in response to the determination, an indication that a data scrubber, scrub one of the memory blocks corresponding to the weight that meets the data scrubbing threshold. Also, the method includes resetting the weight.

20 Claims, 5 Drawing Sheets

(56) References Cited

U.S. PATENT DOCUMENTS

2021/0390179 A1   12/2021  Hahn
2021/0397931 A1*  12/2021  Hoang .................... G06N 3/048
2022/0270639 A1*   8/2022  Rivkin .................... G06F 17/16

* cited by examiner

MAGNETORESISTIVE RANDOM ACCESS MEMORY WITH DATA SCRUBBING

BACKGROUND

The present disclosure relates to magnetoresistive random access memory (MRAM), and more specifically, to MRAM with data scrubbing.

A data scrubber can be an apparatus that corrects errors in a memory cell array. Error correction is thus referred to as scrubbing. Accordingly, a data scrubber may perform scrubbing based on accumulated errors during reads by a memory controller.

SUMMARY

Embodiments are disclosed for a system that includes a data scrubbing circuit, a magnetoresistive random access memory (MRAM) having a memory array, and an analog persistent vital information circuit (APVIC) that performs a method. The method includes resetting weights corresponding to blocks of the memory array. The method further includes adjusting the weights based on a timer, data accesses on the memory blocks, and weight change values corresponding to the weights. The method also includes determining, in response to the timer, a data scrubbing threshold based on ambient temperature and magnetic field strength. The method additionally includes determining one of the weights meets the data scrubbing threshold. Further, the method includes providing, in response to the determination, an indication that a data scrubber, scrub one of the memory blocks corresponding to the weight that meets the data scrubbing threshold. Also, the method includes resetting the weight.

Further aspects of the present disclosure are directed toward computer program products with functionality similar to the functionality discussed above regarding the computer-implemented method. The present summary is not intended to illustrate each aspect of, every implementation of, and/or every embodiment of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
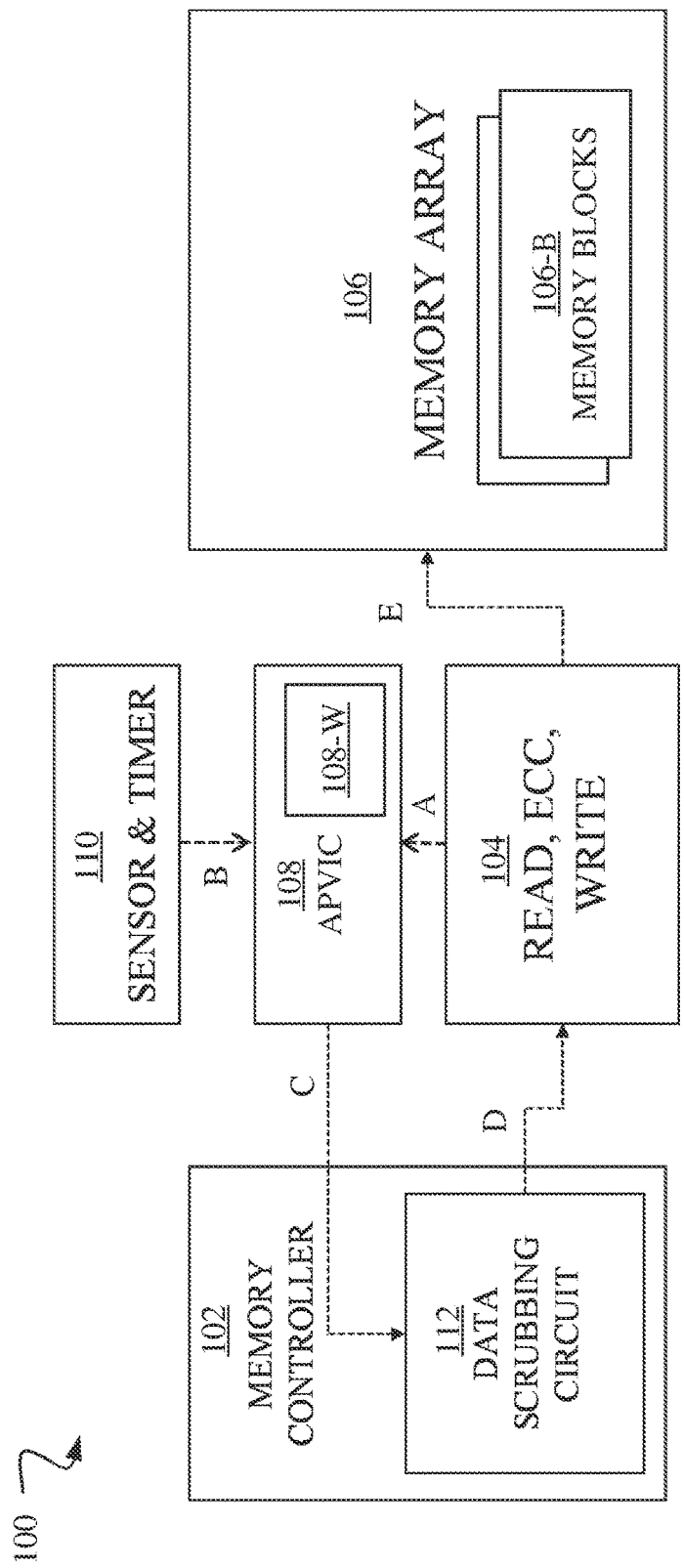
FIG. 1 is a block diagram of an example magnetoresistive random access memory (MRAM), in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

As stated previously, a data scrubber can be an apparatus that corrects errors in a memory cell array. One use of memory cell arrays can be in last level cache (LLC) applications. LLC applications can reduce the latency of memory operations by reducing access to memory that is off-chip. However, optimizing MRAM devices for LLC applications can be technically challenging. One approach to these technical challenges can involve relaxing the retention properties of the MRAM in order to get better speed and cycling endurance. However, relaxing the retention properties can cause error accumulation at higher ambient temperatures, and increase the sensitivity of the MRAM to magnetic fields. Further, the temperature and external field fluctuations can introduce errors to the memory, causing malfunctions. Another challenge with data scrubbing can be that the whole memory array is scrubbed during each cycle of data scrubbing. Unfortunately, this approach can cause unnecessary power consumption and memory wear.

Accordingly, some embodiments of the present disclosure can provide an MRAM memory array and controller with a data scrubbing function. Additionally, such embodiments can include temperature and magnetic field sensors. According to some embodiments of the present disclosure, an analog persistent vital information circuit (APVIC) can determine a threshold for data scrubbing individual blocks of memory based on the time between writes, ambient temperature, and/or magnetic field strength. Accordingly, the APVIC can direct a data scrubbing circuit to scrub the individual blocks based on the data scrubbing threshold.

In this way, some embodiments of the present disclosure can be useful to enable an LLC MRAM. Further, some embodiments of the present disclosure can allow a wider operation range (with respect to ambient temperature and external magnetic field) than current systems. Additionally, in such embodiments, the APVIC can scrub each memory block individually for improved energy efficiency and longer memory lifetimes than current systems that scrub the entire memory array.

FIG. 1 is a block diagram of an example MRAM 100, in accordance with some embodiments of the present disclosure. The MRAM 100 can be a memory device found on computing devices, such as a desktop computer, mobile computing device, laptop, tablet, server computing device, blade server, rack server, cloud server, and the like. The MRAM 100 includes a memory controller 102; read, error correction code (ECC), and write circuit 104; memory array 106; APVIC 108; and sensor and timer 110. The memory array 106 can include multiple memory blocks 106-B for storing data.

The memory controller 102 can be a circuit that controls the flow of data into, and out of the MRAM 100. More specifically, the memory controller 102 can direct the read, ECC, and write circuit 104 to read data from, and write data to, the memory array 106. Additionally, the read, ECC, and write circuit 104 can include error correction code that can detect errors in the memory array 106 (e.g., one or more bits in memory having an incorrect value). In response to detecting an error in a value stored in a block of the memory array 106, the ECC may cause the read, ECC, and write circuit 104 to perform a write back. In some cases, the read, ECC, and write circuit 104 may re-write all the bits of the value in error. Alternatively, the ECC may cause the read, ECC, and write circuit 104 to merely re-write the individual bit(s) in error.

Additionally, the memory controller 102 can include a data scrubbing circuit 112. The data scrubbing circuit 112 can perform data scrubbing on data stored in the memory array 106 in response to a signal from the APVIC 108. According to some embodiments of the present disclosure, the APVIC 108 can store a data scrubbing threshold (not shown) and APVIC weights 108-W. The APVIC weights 108-W can represent a phase change memory (PCM), re-RAM (RRAM), spin-transfer torque MRAM (STT-MRAM), or the like. The APVIC weights 108-W can store APVIC weights 108-W for each of the memory blocks 106-B in the memory array 106. The APVIC weights 108-W may indicate how long since the last reset (e.g., zeroing) of a memory block, and how many read accesses have been performed on the corresponding memory block 106-B.

According to some embodiments of the present disclosure, the APVIC 108 can increment the APVIC weight 108-W corresponding to a memory block 106-B whenever the read, ECC, and write circuit 104 performs a read operation on that memory block 106-B in the memory array 106. Further, when an APVIC weight 108-W for a memory block 106-B exceeds the data scrubbing threshold, the APVIC 108 may signal the data scrubbing circuit 112 to scrub the corresponding block of memory. Additionally, the APVIC 108 may zero the APVIC weight 108-W for the memory block 106-B. Each of the APVIC weights 108-W representing different memory blocks, may differ from each other. In this way, the APVIC 108 can customize how many memory operations trigger data scrubbing for each memory block 106-B, even though they are using the same data scrubbing threshold.

Further, the sensor and timer 110 can include sensors that measure ambient temperature and magnetic field strength. However, temperature and magnetic field strength can affect the stability of the values stored in the memory array 106, and thus, the frequency of data scrubbing sufficient to maintain the memory array 106. Accordingly, to some embodiments of the present disclosure, the APVIC 108 can adjust the data scrubbing threshold based on the ambient temperature, magnetic field strength, and a clock signal. More specifically, the sensor and timer 110 can include a timer mechanism that sends a clock signal to the APVIC 108. In response to the clock signal, the APVIC 108 may increment all the APVIC weights 108-W. Further, the sensor and timer 110 may send, in addition to the clock signal, the temperature and magnetic field strength data to the APVIC 108. Accordingly, the APVIC 108 can update the data scrubbing threshold based on the ambient temperature and magnetic field strength. In this way, some embodiments of the present disclosure can perform data scrubbing based on the amount of time between resets of the APVIC weight 108-W for a memory block 106-B, ambient temperature, and magnetic field strength. In other words, the data scrubbing threshold may be similar to an adjustable timer. The number of clock signals that result in increments of the APVIC weights 108-W can represent a time limit before the APVIC 108 signals a data scrubbing operation. However, the temperature and magnetic field strength can speed up or slow down that time limit because the APVIC 108 can increase or decrease the data scrubbing threshold based on ambient temperature and magnetic field strength. For example, the data scrubbing threshold can indicate that: at an ambient temperature of 25 degrees Celsius, and a magnetic field strength of 0 Oe, the data scrubbing circuit 112 performs data scrubbing every 1 minute. Alternatively, the data scrubbing threshold can indicate that: at an ambient temperature of 100 degrees Celsius and a magnetic field strength of 0 Oe, the data scrubbing circuit 112 performs data scrubbing every 20 seconds. Accordingly, under each of these conditions, the APVIC 108 can update the data scrubbing threshold as the operating environment changes over time. In this way, the APVIC 108 can increase or decrease the frequency of data scrubbing to accommodate changing temperature and magnetic fields of the operating environment.

Additionally, the lines indicated with letters A through E, can represent an example of techniques for data scrubbing the memory array 106 according to some embodiments of the present disclosure. More specifically, the line A can indicate that the APVIC 108 monitors reads, ECC, and writes to the memory array 106. Monitoring can mean that the APVIC 108 listens for the reads, ECC, and writes to each block of memory in the memory array 106. As stated previously, each of the APVIC weights 108-W can correspond to one block of the memory array 106. Accordingly, when the read, ECC, and write circuit 104 reads a memory block 106-B of the memory array 106, the APVIC 108 can increment the APVIC weight 108-W corresponding to the memory block 106-B. In contrast, when the read, ECC, and write circuit 104 writes to a block of the memory array 106, the APVIC 108 can reset, e.g., zero, the APVIC weight 108-W for the corresponding memory block 106-B. With respect to ECC operations, if the ECC write-back re-writes all bits to the correct state, the APVIC 108 can reset the corresponding APVIC weight 108-W to zero, similar to how a write to a memory block 106-B results in the APVIC 108 setting the corresponding APVIC weight 108-W to zero. However, if the ECC write-back merely writes to the bit detected to be incorrect, the APVIC 108 may increment the corresponding APVIC weight 108-W, like a read operation.

The line B represents a signal from the sensor and timer 110 that provides a clock pulse to the APVIC 108, along with the current ambient temperature and magnetic field strength. Accordingly, the APVIC 108 can change the data scrubbing threshold as the operating environment of the MRAM 100 changes. For example, as the ambient temperature increases, the APVIC 108 can decrease the data scrubbing threshold. Conversely, as the temperature drops, the APVIC 108 can increase the data scrubbing threshold. Similarly, as the strength of the magnetic field increases, the APVIC 108 can decrease the data scrubbing threshold. Conversely, as the strength of the magnetic field drops, the APVIC 108 can increase the data scrubbing threshold.

Additionally, in response to a clock signal from the sensor and timer 110, the APVIC 108 can increment all the stored APVIC weights 108-W in the APVIC weights 108-W. Further, the APVIC 108 can compare the incremented APVIC weights 108-W against the current data scrubbing threshold. Once the data scrubbing threshold is reached for a memory block 106-B, the line C represents a signal from the APVIC 108 that triggers the data scrubbing circuit 112 to scrub the memory block 106-B. In this way, determining when to perform data scrubbing is dependent upon a combination of the time since last reset (e.g., last write operation), temperature, and external magnetic field.

According to some embodiments of the present disclosure, the APVIC 108 may decrement the data scrubbing threshold (instead of incrementing all the APVIC weights 108-W) when the APVIC 108 receives a clock signal from the sensor and timer 110. The amount that the APVIC 108 decrements the data scrubbing threshold may be programmed into the circuit itself, and be dependent upon a product specification for the MRAM 100.

The line D represents a signal from the data scrubbing circuit 112 to the read, ECC, and write circuit 104 to perform the data scrubbing. Further, the line E represents a signal from the read, ECC, and write circuit 104 to scrub the memory block 106-B.

According to some embodiments of the present disclosure, the APVIC weights 108-W can be similar to PCMs used for deep neural networks (DNNs). However, in contrast to the increment and decrement operations typically performed on PCMs, some embodiments of the present disclosure are limited to performing increment operations or decrement operations on the APVIC weights 108-W and data scrubbing threshold, not both.

Figure 2:
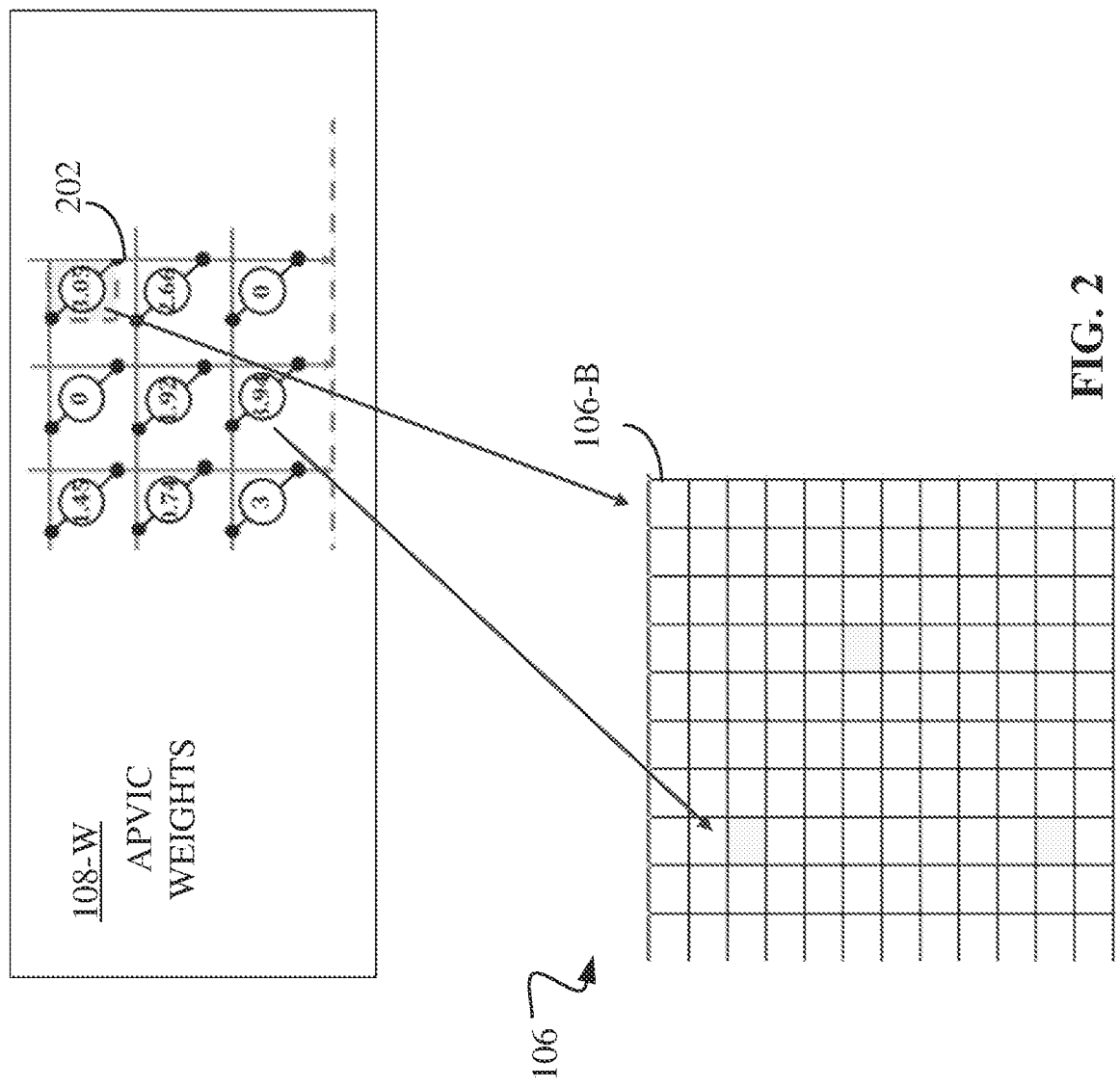
FIG. 2 is a block diagram of an example analog persistent vital information circuit (APVIC) weights and memory array, in accordance with some embodiments of the present disclosure.

FIG. 2 is a block diagram of the example APVIC weights 108-W and memory array 106, in accordance with some embodiments of the present disclosure. More specifically, the APVIC weights 108-W can represent a phase-change memory (PCM). Prototypes of PCMs have been made to demonstrate up to 1000 unique levels per cell, with each level being represented by set conductance states that translate to an analog value, and can be decoded by tuned comparator circuits. Drawbacks that traditionally apply for DNN workloads may not apply to embodiments of the present disclosure because there is no constant fine-tuning of the APVIC weights 108-W—as the APVIC weights 108-W are incremented in one direction only, either incrementing or decrementing. Further, experimental results and simulations on PCMs suggest that thermal disturbance and resistance drift are the potential reliability concerns in PCM.

Additionally, the example APVIC weights 108-W include multiple analog memory units 202. Each of the analog memory units 202 can represent a block 106-B in the memory array 106. As shown, each of the analog memory units 202 stores a numeric value, representing an APVIC weight 108-W. The APVIC 108, described with respect to FIG. 1, can increment the APVIC weight 108-W value each time the memory array 106 is read. Accordingly, once the APVIC weight 108-W for an analog memory unit 202 exceeds the data scrubbing threshold, the APVIC 108 can signal the data scrubbing circuit 112 to scrub the corresponding memory block 106-B. Depending on the value stored on each of the analog memory units 202, the corresponding memory block 106-B can be scrubbed separately. According to some embodiments of the present disclosure, the memory block 106-B can alternatively represent a memory page, memory, and/or memory segment, depending on the scrubbing schemes of the data scrubbing circuit 112. The lines from the APVIC weights 108-W to the memory array 106 can represent the association between two of the analog memory units 202 and their corresponding memory blocks 106-B.

Advantageously, by performing data scrubbing in this way, the MRAM can consume less energy for scrubbing than current systems, which scrub the whole memory array 106 instead of individual memory blocks 106-B. Further, due to individual scrubbing of memory blocks 106-B (instead of the whole memory array 106), there is less wear on the memory array 106, which can provide improved memory endurance in comparison to current systems for data scrubbing.

Further, with respect to the analog memory unit 202, a monotonical increment of APVIC weight 108-W can be used to trigger the scrubbing, in contrast to PCMs used for DNNs. Additionally, the APVIC 108 can control the data scrubbing threshold based on temperature, magnetic field strength, and/or a data retention requirement. A data retention requirement can indicate, based on the design of the memory array 106, the size of the time step (i.e., amount of time) between data scrubbing operations that prevents the loss of data. Accordingly, in embodiments where the data scrubbing threshold is based on the data retention requirement, the APVIC 108 and sensor and timer 110 can include programming to decrease the data scrubbing threshold or increase the APVIC weights 108-W as time passes such that when the full time step is reached without a write action that resets the APVIC weight 108-W, the APVIC 108 can send a signal to begin data scrubbing.

Figure 3:
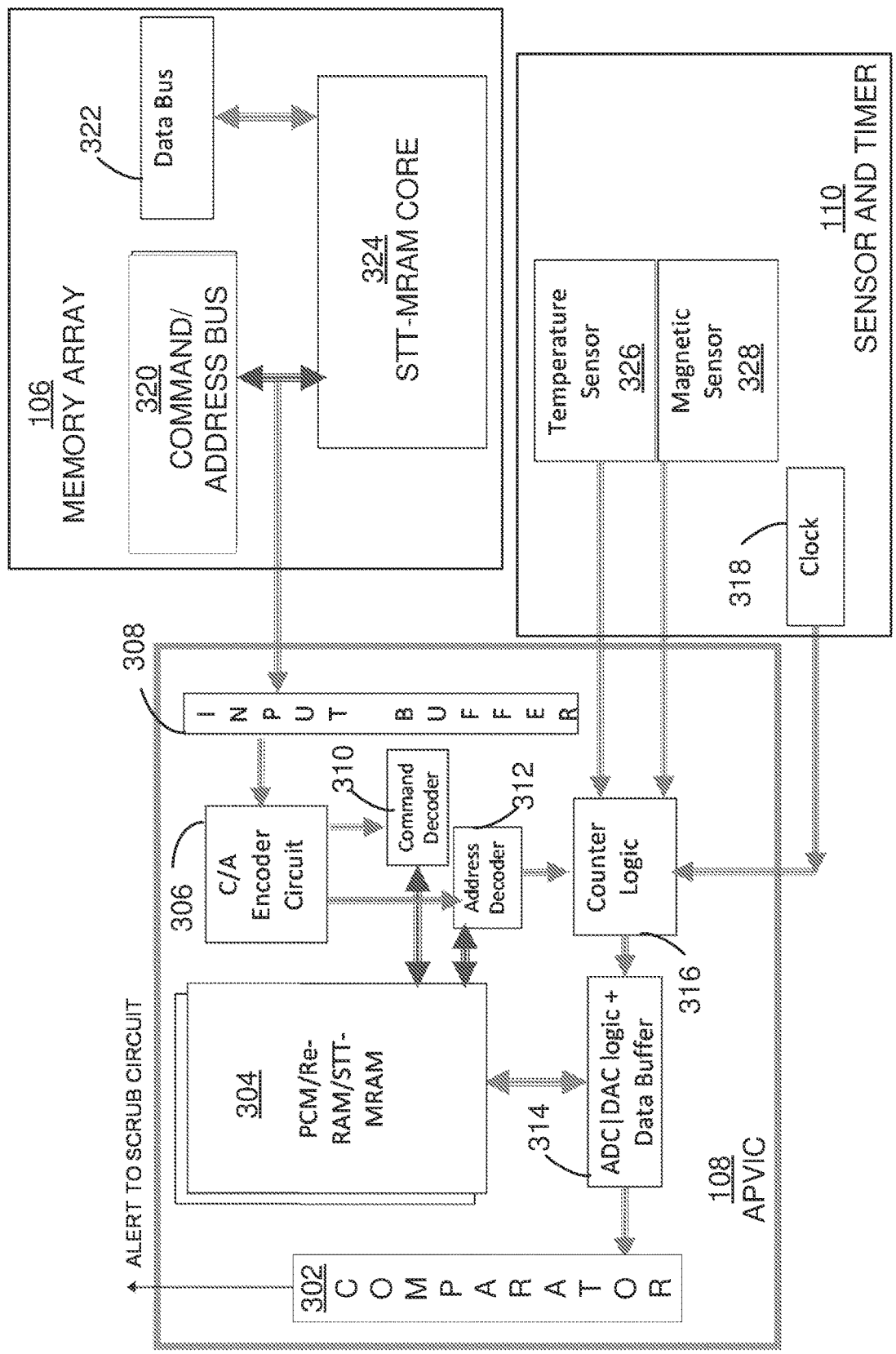
FIG. 3 is a block diagram of an example memory array, APVIC, and sensor and timer, in accordance with some embodiments of the present disclosure.

FIG. 3 is a block diagram of an example memory array 106, APVIC 108, and sensor and timer 110, in accordance with some embodiments of the present disclosure. The example memory array 106 includes a command/address bus 320, data bus 322, and STT-MRAM core 324. The command/address bus for STT-MRAM core 324 can determine the addresses of memory blocks in the STT-MRAM core 324 for performing reads from, and writes to, the STT-MRAM core 324. Further, the data bus 322 can hold the data values being read from, or written to, the STT-MRAM core 324. The two-direction lines between the STT-MRAM core 324 and both the command/address bus 320 and data bus 322 indicate the flow of command names, addresses, and data between the busses and the STT-MRAM core 324. The command names may be read, write, ECC, for example. The addresses may be addresses within the STT-MRAM core 324. Additionally, the line from the command/address bus line to the input buffer 308 can indicate the memory array 106 providing, for the input buffer 308 of the APVIC 108, the command names and addresses of data access operation in the STT-MRAM core 324.

In this way, the APVIC 108 "listens" for the reads, ECC, and writes to each block of memory in the memory array 106. More specifically, using the input buffer 308 enables the APVIC 108 to identify read operations, write operations, ECC operations, and the memory blocks on which the read, ECC, and write circuit 104 performs the operations. Accordingly, the APVIC 108 may update the corresponding APVIC weights 108-W for the relevant memory blocks. As stated previously, the APVIC 108 may increment APVIC weights 108-W for read operations and certain types of ECC operations. Additionally, the APVIC 108 may reset (i.e., zero) APVIC weights 108-W for write operations. The APVIC 108 may identify the relevant memory block based on the address provided.

The sensor and timer 110 includes a clock 318, temperature sensor 326, and magnetic sensor 328. The clock 318 can be a computer clock that provides repeated pulses at the processing speed (i.e., clock speed) of a computer processing device. The line from the clock 318 to the counter logic 316 of the APVIC 108 indicates that the clock 318 provides these pulses to the counter logic 316. The lines from the temperature sensor 326 and magnetic sensor 328 can indicate that, with the pulse, temperature sensor 326 and magnetic sensor 328 may provide the current ambient temperature and magnetic field strength to the counter logic 316. In this way, the APVIC 108 may determine the data scrubbing threshold based on the ambient temperature and magnetic field strength provided. Additionally, the APVIC 108 may update (increment or decrement) the APVIC weights 108-W for all the memory blocks 106-B of the memory array 106.

The APVIC 108 can include a comparator 302, PCM/RRAM/STT-MRAM 304, C/A encoder circuit 306, input buffer 308, command decoder 310, address decoder 312, analog digital conversion (ADC)/digital analog conversion (DAC) logic+data buffer 314, counter logic 316, clock 318, command/address buffer for STT-MRAM core 324, data bus 322, STT-MRAM core 324, temperature sensor 326, and magnetic sensor 328.

As stated previously, the sensor and timer 110 can provide, to the counter logic 316, a clock pulse, along with the current ambient temperature and magnetic field strength. Accordingly, in response, the counter logic 316 may determine the data scrubbing threshold, which can vary with temperature and magnetic field strength. Further, the counter logic 316 may signal the ADC/DAC logic+data buffer 314 to increment all the APVIC weights 108-W in the PCM/RRAM/STT-MRAM 304. In this way, a block that has not been updated relatively recently increases in APVIC weight 108-W and reaches the threshold before memory blocks with more recent write operations. Accordingly, with each update of the data scrubbing threshold. the comparator 302 determines whether to scrub any memory blocks whose APVIC weights 108-W meet the new data scrubbing threshold.

As also stated previously, the memory array 106 may provide, to the input buffer 308, the command names and addresses of data access operations on the STT-MRAM core 324. Further, the C/A encoder circuit 306 can read the data access operation information from the input buffer 308, and parse the information into a command name and a memory address. Further, the lines from the C/A encoder circuit 306 to the command decoder 310 and address decoder 312 can indicate that the C/A encoder circuit 306 provides the command name and address to the command decoder 310 and address decoder 312, respectively. According to some embodiments of the present disclosure, the command decoder 310 can determine how to update the APVIC weight 108-W corresponding to the memory block of the data access. For example, if the command name indicates a read operation (or a partial ECC operation), the command decoder 310 may determine that the APVIC weight 108-W for the corresponding memory block be incremented. Additionally, the address decoder 312 can determine, based on the memory address of the data access operation, the memory block of the data access. Accordingly, the address decoder can determine which of the APVIC weights 108-W stored in the PCM/re-RAM/STT-MRAM 304 is to be updated as a result of the data access operation. Further, the command decoder 310 and address decoder 312 may instruct the PCM/RRAM/STT-MRAM 304 to perform the relevant update to the relevant APVIC weight 108-W.

Additionally, the line from the address decoder 312 to the counter logic 316 can indicate that the address decoder 312 can provide the updated APVIC weight 108-W and identified memory block to the counter logic 316. In response, the counter logic 316 may provide the data scrubbing threshold and the updated APVIC weight 108-W to the ADC/DAC logic+data buffer 314, which may provide this information to the comparator 302. Accordingly, the comparator 302 may determine whether the updated APVIC weight 108-W meets the data scrubbing threshold. If so, the comparator 302 may provide an alert, e.g., signal, to the data scrubbing circuit 112 to data scrub the relevant memory block. Accordingly, with each update of the APVIC weights 108-W in the PCM/RRAM/STT-MRAM 304, the comparator 302 determines whether to scrub the corresponding memory block 106-B.

Figure 4:
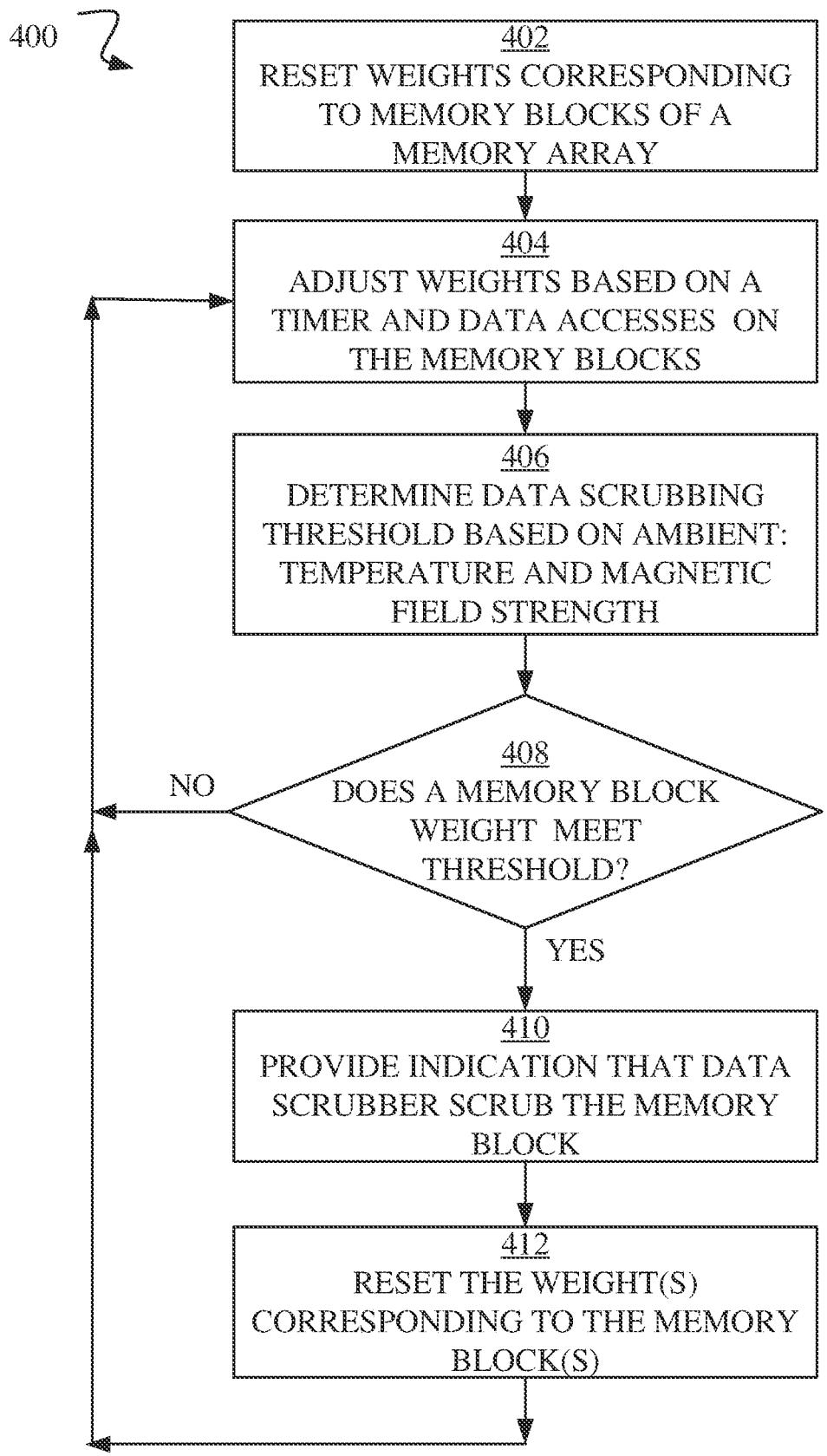
FIG. 4 is a flowchart of an example method for data scrubbing, in accordance with some embodiments of the present disclosure.

FIG. 4 is a flowchart of an example method 400 for data scrubbing, in accordance with some embodiments of the present disclosure. The method 400 can be performed by the elements of the MRAM 100, described with respect to FIG. 1.

At operation 402. The APVIC 108 may reset APVIC weights 108-W corresponding to memory blocks of a memory array. As stated previously, the APVIC 108 may store an APVIC weight 108-W for each memory block 106-B of the memory array 106. Resetting the APVIC weights 108-W may involve setting the value of all the APVIC weights 108-W to zero.

At operation 404, the APVIC 108 can adjust APVIC weights 108-W, data scrubbing threshold based on a timer and data accesses on the memory blocks. Adjusting APVIC weights 108-W based on the timer can involve incrementing (or, decrementing) all the APVIC weights 108-W in response to a clock pulse from the sensor and timer 110. In embodiments that decrement all the APVIC weights 108-W, each of the APVIC weights 108-W may initialize (e.g., reset) to a positive value representing the data scrubbing threshold. Accordingly, when the APVIC weight 108-W reaches zero, or lower, the APVIC 108 may signal the data scrubbing circuit 112 to scrub the corresponding memory block.

An alternative to adjusting all of the APVIC weights 108-W involves decrementing the threshold. Such embodiments may reduce the number of operations the APVIC 108 performs in comparison to adjusting all the APVIC weights 108-W as described previously. In embodiments that decrement the data scrubbing threshold, the APVIC 108 may calculate, or otherwise determine Adjusting APVIC weights 108-W may also involve adjusting APVIC weights 108-W for data access operations on the memory blocks. However, these adjustments may differ based on the type of data access. For example, with respect to read and ECC operations, updating the APVIC weights 108-W can involve determining the memory block 106-B being read from, and sending a signal to update the APVIC weight 108-W corresponding to the memory block 106-B being read. Further, with respect to a write operation, the APVIC 108 can reset, e.g., zero, the APVIC weight 108-W for the corresponding memory block 106.

At operation 406, the APVIC 108 can determine the data scrubbing threshold based on the ambient temperature and magnetic field strength. The temperature and magnetic field strength can affect the stability of the values stored in the memory array 106. Accordingly, the APVIC 108 can determine the data scrubbing threshold based on these values as determined by the sensor and timer 110. For example, the data scrubbing threshold can indicate that at an ambient temperature of 25 degrees Celsius and a magnetic field strength of 100 Oe, the data scrubbing circuit 112 performs data scrubbing every 30 seconds. In this way, the APVIC 108 can adjust how often memory blocks are scrubbed as the operating environment of the MRAM 100 changes over time.

As stated previously, in some embodiments of the present disclosure, the APVIC 108 may decrement the data scrubbing threshold at each clock pulse, instead of adjusting all the APVIC weights 108-W. In such embodiments, when the APVIC 108 performs operation 406, the APVIC 108 may additionally base the new data scrubbing threshold on the current data scrubbing threshold, to account for decremented values.

At operation 408, the APVIC 108 can determine if a memory block APVIC weight 108-W meets the data scrubbing threshold. As stated previously, whenever an APVIC weight 108-W is updated, or a clock pulse received from the sensor and timer 110, the APVIC 108 may determine if an APVIC weight 108-W meets the data scrubbing threshold. This determination can involve using a comparator, e.g., comparator 302, to compare the APVIC weights 108-W corresponding to each memory block 106-B to the data scrubbing threshold. If any of the APVIC weights 108-W exceed the data scrubbing threshold, control of the method 400 can flow to operation 410. If not, control the method 400 can flow to operation 404.

At operation 410, the APVIC 108 can provide an indication for the data scrubbing circuit to scrub the memory block. Providing this indication can involve the APVIC 108 sending a signal to the data scrubbing circuit 112 to scrub the memory block(s) 106-B whose corresponding APVIC weight 108-W(s) exceed the data scrubbing threshold.

At operation 412, the APVIC 108 can reset the APVIC weight 108-W(s) corresponding to the scrubbed memory blocks. Once scrubbed, the memory blocks are reset to zero to allow more time before scrubbing again. Accordingly, control can flow to operation 304.

Figure 5:
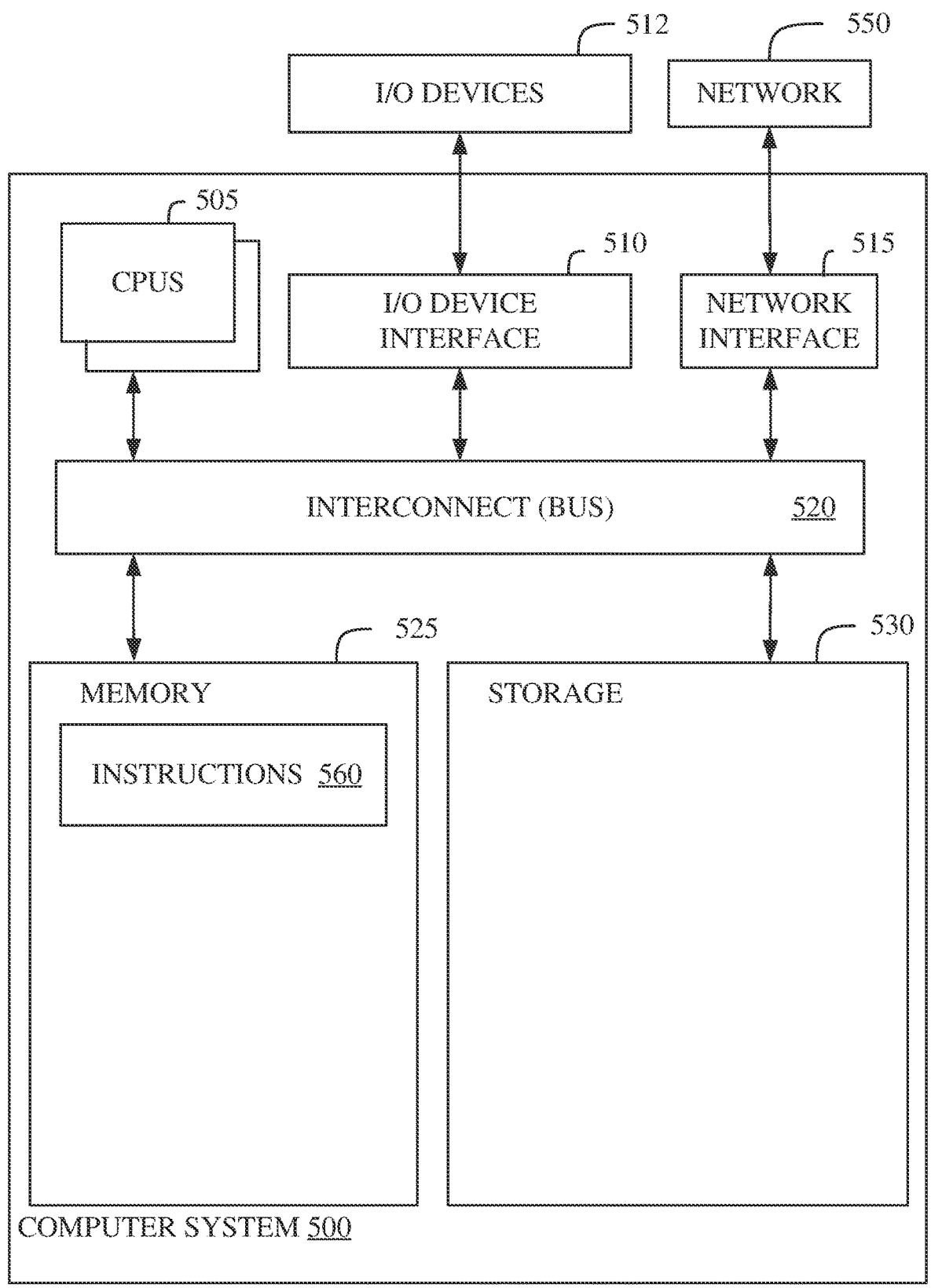
FIG. 5 is a block diagram of an example computer system, in accordance with some embodiments of the present disclosure.

FIG. 5 is a block diagram of an example computer system 500, in accordance with embodiments of the present disclosure. In various embodiments, the computer system 500 can perform the method described in FIG. 4 and/or the functionality discussed in FIGS. 1-3. In some embodiments, the computer system 500 provides instructions for the aforementioned methods and/or functionalities to a client machine such that the client machine executes the method, or a portion of the method, based on the instructions provided by the computer system 500. In some embodiments, the computer system 500 comprises software executing on hardware incorporated into a plurality of devices.

The computer system 500 includes a memory 525, multi-tiered storage 530, an interconnect (e.g., BUS) 520, one or more CPUs 505 (also referred to as processors 505 herein), an I/O device interface 510, I/O devices 512, and a network interface 515.

Each CPU 505 retrieves and executes programming instructions stored in the memory 525 or the storage 530. The interconnect 520 is used to move data, such as programming instructions, between the CPUs 505, I/O device interface 510, storage 530, network interface 515, and memory 525. The interconnect 520 can be implemented using one or more busses. The CPUs 505 can be a single CPU, multiple CPUs, or a single CPU having multiple processing cores in various embodiments. In some embodiments, a CPU 505 can be a digital signal processor (DSP). In some embodiments, CPU 505 includes one or more 3D integrated circuits (3DICs) (e.g., 3D wafer-level packaging (3DWLP), 3D interposer-based integration, 3D stacked ICs (3D-SICs), monolithic 3D ICs, 3D heterogeneous integration, 3D system in package (3DSiP), and/or package on package (PoP) CPU configurations). Memory 525 is generally included to be representative of a random access memory (e.g., static random access memory (SRAM), dynamic random access memory (DRAM), or Flash). The storage 530 is generally included to be representative of a non-volatile memory, such as a hard disk drive, solid state device (SSD), removable memory cards, optical storage, and/or flash memory devices. Additionally, the storage 530 can include storage area-network (SAN) devices, the cloud, or other devices connected to the computer system 500 via the I/O device interface 510 or a network 550 via the network interface 515.

In some embodiments, the memory 525 stores instructions 560 and the storage 530 stores data 532. However, in various embodiments, the instructions 560 and data 532 are stored partially in memory 525 and partially in storage 530, or they are stored entirely in memory 525 or entirely in storage 530, or they are accessed over a network 550 via the network interface 515.

Instructions 560 can be processor-executable instructions for performing any portion of, or all, any of the method of FIG. 4 and/or any of the functionality discussed herein. The data 532 may include power-proxy signal and/or CPM signal information.

In various embodiments, the I/O devices 512 include an interface capable of presenting information and receiving input. For example, I/O devices 512 can present information to a user interacting with computer system 500 and receive input from the user.

The computer system 500 is connected to the network 550 via the network interface 515. Network 550 can comprise a physical, wireless, cellular, or different network.

In some embodiments, the computer system 500 can be a multi-user mainframe computer system, a single-user system, or a server computer or similar device that has little or no direct user interface but receives requests from other computer systems (clients). Further, in some embodiments, the computer system 500 can be implemented as a desktop computer, portable computer, laptop or notebook computer, tablet computer, pocket computer, telephone, smart phone, network switches or routers, or any other appropriate type of electronic device.

As discussed in more detail herein, it is contemplated that some or all of the operations of some of the embodiments of methods described herein can be performed in alternative orders or may not be performed at all; furthermore, multiple operations can occur at the same time or as an internal part of a larger process.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A system comprising:
   a data scrubbing circuit;
   a magnetoresistive random access memory (MRAM) comprising a memory array in electrical contact with the data scrubbing circuit; and
   an analog persistent vital information circuit (APVIC) that is configured to perform a method comprising:
   resetting a plurality of weights corresponding to a plurality of memory blocks of the memory array;
   adjusting the plurality of weights based on a timer, a plurality of data access operations on one or more of the plurality of memory blocks, and a plurality of weight change values corresponding to the plurality of weights;
   determining, in response to the timer, a data scrubbing threshold based on an ambient temperature and an ambient magnetic field strength;
   determining that one of the plurality of weights meets the data scrubbing threshold;
   in response to the determination, providing an indication for a data scrubber to, scrub a memory block of the plurality of memory blocks corresponding to the one weight; and
   resetting the one weight.

2. The system of claim 1, wherein the APVIC comprises an analog memory storing the plurality of weights.

3. The system of claim 2, wherein the analog memory adjusts the plurality of weights in one direction.

4. The system of claim 1, the method further comprising increasing the plurality of weights by the plurality of weight change values for each clock pulse.

5. The system of claim 1, the method further comprising decrementing the data scrubbing threshold for each clock pulse.

6. The system of claim 1, the method further comprising updating a read of one of the plurality of weights corresponding to a read memory block of the plurality of memory blocks in response to a read of the read memory block.

7. The system of claim 1, the method further comprising resetting a written memory block weight of the plurality of weights for a written memory block, in response to a write to the written memory block.

8. The system of claim 1, the method further comprising updating an error code corrected one of the plurality of weights corresponding to an error code corrected memory block of the plurality of memory blocks in response to an error code correction of one bit of the of the error code corrected memory block.

9. The system of claim 1, the method further comprising resetting an error code corrected memory block weight of the plurality of weights for an error code corrected memory block, in response to an error code correction to all bits of a stored value of the error code corrected memory block.

10. The system of claim 1, further comprising:
a temperature sensor that determines the ambient temperature;
a magnetic field sensor that determines the ambient magnetic field strength; and
a timer that provides, for the APVIC:
a clock pulse;
the ambient temperature; and
the ambient magnetic field strength.

11. A computer-implemented method comprising:
resetting a plurality of weights corresponding to a plurality of memory blocks of a memory array;
adjusting the plurality of weights based on a timer, a plurality of data access operations on one or more of the plurality of memory blocks, and a plurality of weight change values corresponding to the plurality of weights;
determining, in response to the timer, a data scrubbing threshold based on an ambient temperature and an ambient magnetic field strength;
determining that one of the plurality of weights meets the data scrubbing threshold; and
in response to the determination, providing an indication for a data scrubber to, scrub a memory block of the plurality of memory blocks corresponding to the one weight; and resetting the one weight.

12. The method of claim 11, the method further comprising increasing the plurality of weights by the plurality of weight change values for each clock pulse.

13. The method of claim 11, the method further comprising decrementing the data scrubbing threshold for each clock pulse.

14. The method of claim 11, the method further comprising updating a read of one of the plurality of weights corresponding to a read memory block of the plurality of memory blocks in response to a read of the read memory block.

15. The method of claim 11, the method further comprising resetting a written memory block weight of the plurality of weights for a written memory block, in response to a write to the written memory block.

16. The method of claim 11, the method further comprising updating an error code corrected one of the plurality of weights corresponding to an error code corrected memory block of the plurality of memory blocks in response to an error code correction of one bit of the of the error code corrected memory block.

17. The method of claim 11, the method further comprising resetting an error code corrected memory block weight of the plurality of weights for an error code corrected memory block, in response to an error code correction to all bits of a stored value of the error code corrected memory block.

18. A computer program product including program instructions stored on a computer readable storage medium, the program instructions executable by a processor to cause the processor to perform a method comprising:
resetting a plurality of weights corresponding to a plurality of memory blocks of a memory array;
adjusting the plurality of weights based on a timer, a plurality of data access operations on one or more of the plurality of memory blocks, and a plurality of weight change values corresponding to the plurality of weights;
determining, in response to the timer, a data scrubbing threshold based on an ambient temperature and an ambient magnetic field strength;
determining that one of the plurality of weights meets the data scrubbing threshold; and
in response to the determination, providing an indication for a data scrubber to, scrub a memory block of the plurality of memory blocks corresponding to the one weight; and resetting the one weight.

19. The computer program product of claim 18, the method further comprising updating an error code corrected one of the plurality of weights corresponding to an error code corrected memory block of the plurality of memory blocks in response to an error code correction of one bit of the of the error code corrected memory block.

20. The method of claim 18, the method further comprising resetting an error code corrected memory block weight of the plurality of weights for an error code corrected memory block, in response to an error code correction to all bits of a stored value of the error code corrected memory block.

* * * * *